United States Patent
Scholz

(12) 
(10) Patent No.: US 6,951,822 B2
(45) Date of Patent: Oct. 4, 2005

(54) METHOD FOR FORMING INSIDE NITRIDE SPACER FOR DEEP TRENCH DEVICE DRAM CELL

(75) Inventor: Arnd Scholz, Poughkeepsie, NY (US)

(73) Assignee: Infineon Technologies North America Corp., San Jose, CA (US)

(*) Notice: Subject to any disclaimer, the term of this patent is extended or adjusted under 35 U.S.C. 154(b) by 240 days.

(21) Appl. No.: 09/967,225

(22) Filed: Sep. 28, 2001

(65) Prior Publication Data

US 2003/0064589 A1 Apr. 3, 2003

(51) Int. Cl.$^7$ ............................................. H01L 21/302
(52) U.S. Cl. ..................... 438/710; 438/713; 438/719; 438/723; 438/724
(58) Field of Search ................................. 438/710, 713, 438/719, 723, 724, 743

(56) References Cited

U.S. PATENT DOCUMENTS

| | | | | |
|---|---|---|---|---|
| 5,605,603 A | * | 2/1997 | Grimard et al. | ............ 438/715 |
| 6,008,104 A | * | 12/1999 | Schrems | ..................... 438/386 |
| 6,339,241 B1 | * | 1/2002 | Mandelman et al. | ....... 257/301 |

* cited by examiner

Primary Examiner—Benjamin L. Utech
Assistant Examiner—Binh X. Tran

(57) ABSTRACT

A method is provided for forming an inside nitride spacer in a deep trench device DRAM cell. The method includes etching a stud from a semiconductor material including a first spacer positioned on the sidewalls of the deep trench, wherein two of the sidewalls are formed of isolation trench oxide. The method further includes depositing an oxide layer on the surface of the semiconductor, and depositing a second spacer in the deep trench of the semiconductor, wherein the second spacer has a positive taper relative to the isolation trench oxide.

14 Claims, 7 Drawing Sheets

METHOD FOR FORMING INSIDE NITRIDE SPACER FOR DEEP TRENCH DEVICE DRAM CELL

BACKGROUND OF THE INVENTION

1. Field of the Invention

The present invention relates to semiconductor devices, and more particularly to an inside nitride spacer for deep trench device DRAM cells.

2. Discussion of Prior Art

The development of deep trench dynamic random access memory (DRAM) cells has led to fast chips having smaller critical dimensions and greater storage capacity. Among various memory types, deep trench DRAM cells in particular need space, and therefore high-density deep trench DRAM cells have been difficult to achieve. One problem is that deep trench DRAM cells can be prone to wordline (WL) to bitline (BL) shorts.

A wordline can be protected by a nitride spacer and cap as in prior planar array device DRAM cells. In the trench-sidewall vertical device DRAM cell the WL runs directly over the gate poly of the vertical device, which is buried in the top part of the trench. Since the WL is typically about 30% narrower then the top width of the trench, the WL does not cap the trench completely. Even after the spacer is put in place, and assuming a perfect WL to deep trench alignment, the top of the vertical gate poly is unprotected and can connect to the contact bitline.

Planar array device technologies include nitride spacers to protect the sidewall of the gate conductor line and prevent shorts. The top deep trench width is typically larger than the gate conductor line width. Therefore, only a deep trench top spacer, which has a good overlap to the gate conductor spacer, can provide continuous protection against a bitline contact.

Gate conductor shorts caused by stringers are a particular problem in deep trench cells within vertical devices. The stringers are poly Si stringers along the isolation trench boundaries within the trench, along the short axis of the trench. The shorts are typically created during the isolation trench process and can be fixed after the active area (AA) structuring process. Specific failures result from poly stringers being left after gate etch, vias, or contacts that did not open.

Therefore, a need exists for an inside nitride spacer for deep trench device DRAM cells for isolating bitline contacts from wordlines.

SUMMARY OF THE INVENTION

According to an embodiment of the present invention, a method is provided for forming an inside nitride spacer in a deep trench device DRAM cell. The method includes etching a stud from a semiconductor material including a first spacer positioned on the sidewalls of the deep trench, wherein two of the sidewalls are formed of isolation trench oxide. The method further includes depositing an oxide layer on the surface of the semiconductor, and depositing a second spacer in the deep trench of the semiconductor, wherein the second spacer has a positive taper relative to the isolation trench oxide.

The method further includes etching a portion of the second spacer from a bottom portion of the deep trench, wherein a gate poly of the deep trench is exposed, and performing an ozone cleaning to remove exposed portions of the oxide layer from the semiconductor. The method includes depositing a poly stud, filling the deep trench, polishing the semiconductor to a top trench oxide layer, and stripping a portion of a pad nitride layer.

The first spacer was formed by a conservation method. The conservation method further comprises depositing an oxide liner in a trench etched from a semiconductor material, wherein the oxide lines abuts a pad nitride layer, a pad oxide layer under the pad nitride layer, and a recessed gate poly in the trench. The conservation method includes depositing a spacer material on the oxide liner, removing exposed portions of the oxide layer from the semiconductor, and depositing a poly stud material over the semiconductor wherein the spacer material is encapsulated in poly stud material. The conservation method includes polishing the semiconductor to the top trench oxide layer, and etching the top trench oxide layer.

The first spacer is formed at a depth shallower than a junction depth. The second spacer is deposited having a positive taper on the isolation trench oxide. The thickness of the first spacer is reduced by the thickness of the second spacer, wherein a combined width of the first and second spacer overlap a gate conductor spacer adjacent to the wordline, wherein the first and second spacers substantially prevents a bitline contact from contacting the gate poly material in the trench.

According to an embodiment of the present invention, a method is provided for forming an inside nitride spacer in a deep trench device DRAM cell. The method includes etching a stud from a semiconductor material including a first spacer positioned on the sidewalls of the deep trench, wherein two of the sidewalls are formed of isolation trench oxide. The method further includes depositing an oxide layer on the surface of the semiconductor, depositing a second spacer in the deep trench of the semiconductor, and etching a portion of the second spacer from a bottom portion of the deep trench, wherein a gate poly of the deep trench is exposed. The method includes performing an ozone cleaning to remove exposed portions of the oxide layer from the semiconductor, and depositing a poly stud, filling the deep trench. The method further includes polishing the semiconductor to a top trench oxide layer, and stripping a portion of a pad nitride layer.

The first spacer was formed by a conservation method. The conservation method further comprises depositing an oxide liner in a trench etched from a semiconductor material, wherein the oxide abuts a pad nitride layer, a pad oxide layer under the pad nitride layer, and a recessed gate poly in the trench. The conservation method includes depositing a spacer material on the semiconductor, etching the spacer to below a top surface of the pad nitride, and performing an ozone cleaning to remove exposed portions of the oxide layer from the semiconductor. The conservation method includes depositing a poly stud material over the semiconductor wherein the trench is filled with the poly stud material, polishing the semiconductor to the top trench oxide layer, and etching the top trench oxide payer.

The first spacer is formed at a depth shallower than a junction depth. The second spacer is deposited having a positive taper on the isolation trench oxide. The thickness of the first spacer is reduced by the thickness of the second spacer, wherein a combined width of the first and second spacer overlap a gate conductor spacer adjacent to the wordline, wherein the first and second spacers substantially prevents a bitline contact from contacting the gate poly material in the trench.

According to an embodiment of the present invention, a deep trench vertical dynamic access memory semiconductor device is provided including an oxide liner in an upper portion of a trench, and a vertical gate poly filling a portion of the trench. The deep trench vertical dynamic access memory semiconductor device further includes a first spacer, formed on the oxide liner prior to and conserved during an active area process, for preventing contact between the vertical gate poly and a bitline contact, and a second spacer, formed on an isolation trench oxide, wherein the second spacer forms a positive taper on a portion of the isolation trench oxide.

A thickness of the first and the second spacers overlaps a gate conductor spacer according to a critical distance and an overlay tolerance.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

The present invention provides a method for eliminating the poly stringer shorts. The present invention assumes a spacer conservation method for the deep trench top inside nitride spacer has been implemented as disclosed in co-pending application Ser. No. 09/967,226, filed Sep. 28, 2001, entitled "Method for Forming Inside Nitride Spacer for Deep Trench Device DRAM", incorporated by reference herein in its entirety.

To avoid creating a short, a spacer is needed in the top part of the deep trench. The method includes depositing an oxide later after the spacer etch. A poly Si stud is deposited but is not connected to the gate poly. The poly stud is a sacrificial poly stud and can be easily removed after the IT processing. Within the deep trench processing, the double spacer process is similar to the spacer conservation but has an additional oxide liner before the stud deposition. The present invention adds a second deep trench top inside spacer at the end of an isolation trench method. The potential stringers along isolation trench oxide boundaries are cleared out and a nitride spacer is deposited.

Figure 1:
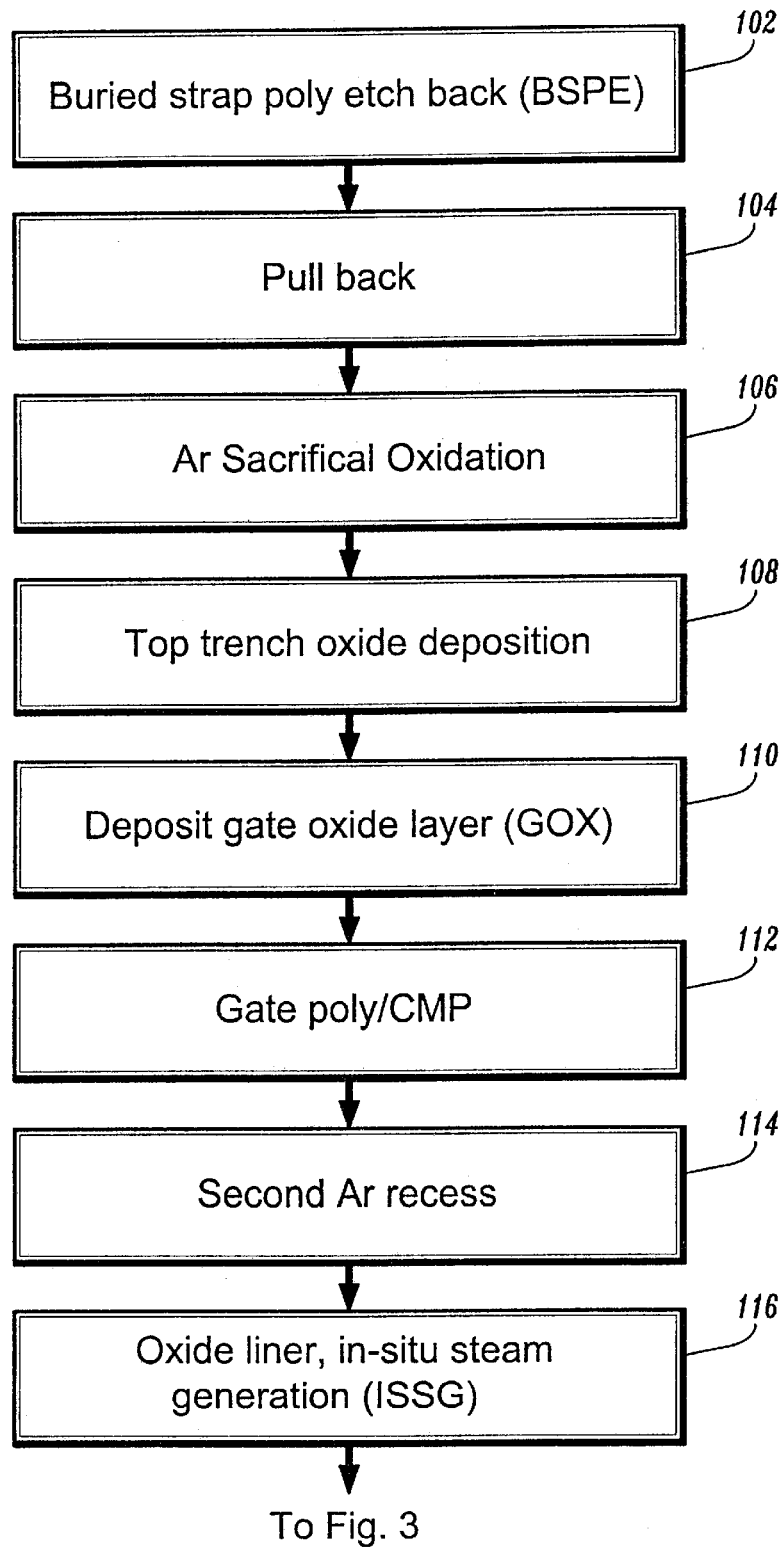
FIG. 1 is a flow chart of a method according to an embodiment of the present invention.

The spacer conservation method is described with respect to FIG. 1. A buried strap is formed according to a poly etch back method 102. The method includes a pull back 104 and an array sacrificial oxidation 106 to remove impurities. A top trench oxide is grown over the surface of the semiconductor 108. A gate poly oxide layer is grown over the top trench oxide 110. A chemical mechanical polish removes portions of the gate poly oxide layer 112 and a second array recess is performed 114 to remove gate poly to a desired depth, e.g., 60 nm, which is shallower than a junction depth. An oxide liner is grown 116 via a wet oxidation, for example, in-situ steam generation. The wet oxidation grows the oxide on the pad nitride as well as the poly silicon.

Figure 2:
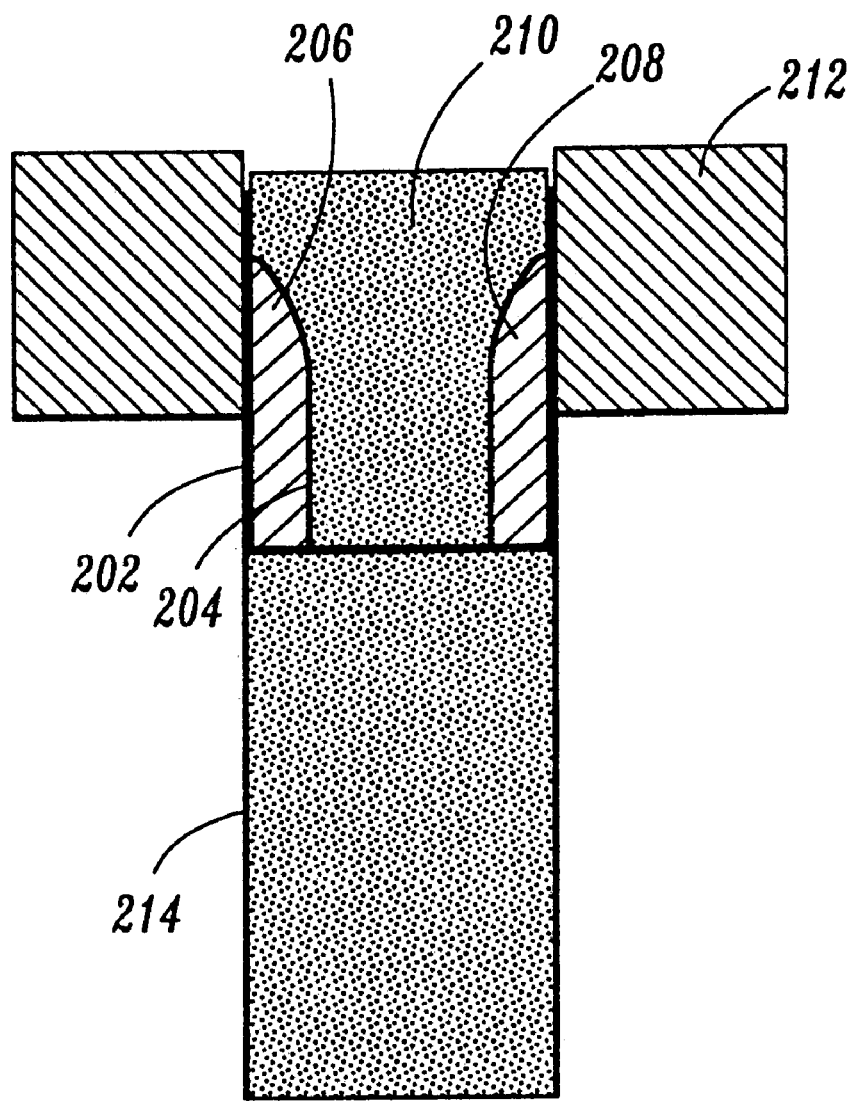
FIG. 2 is a diagram of a cross-section of a trench-sidewall vertical device DRAM cell according to an embodiment of the present invention.
Figure 6:
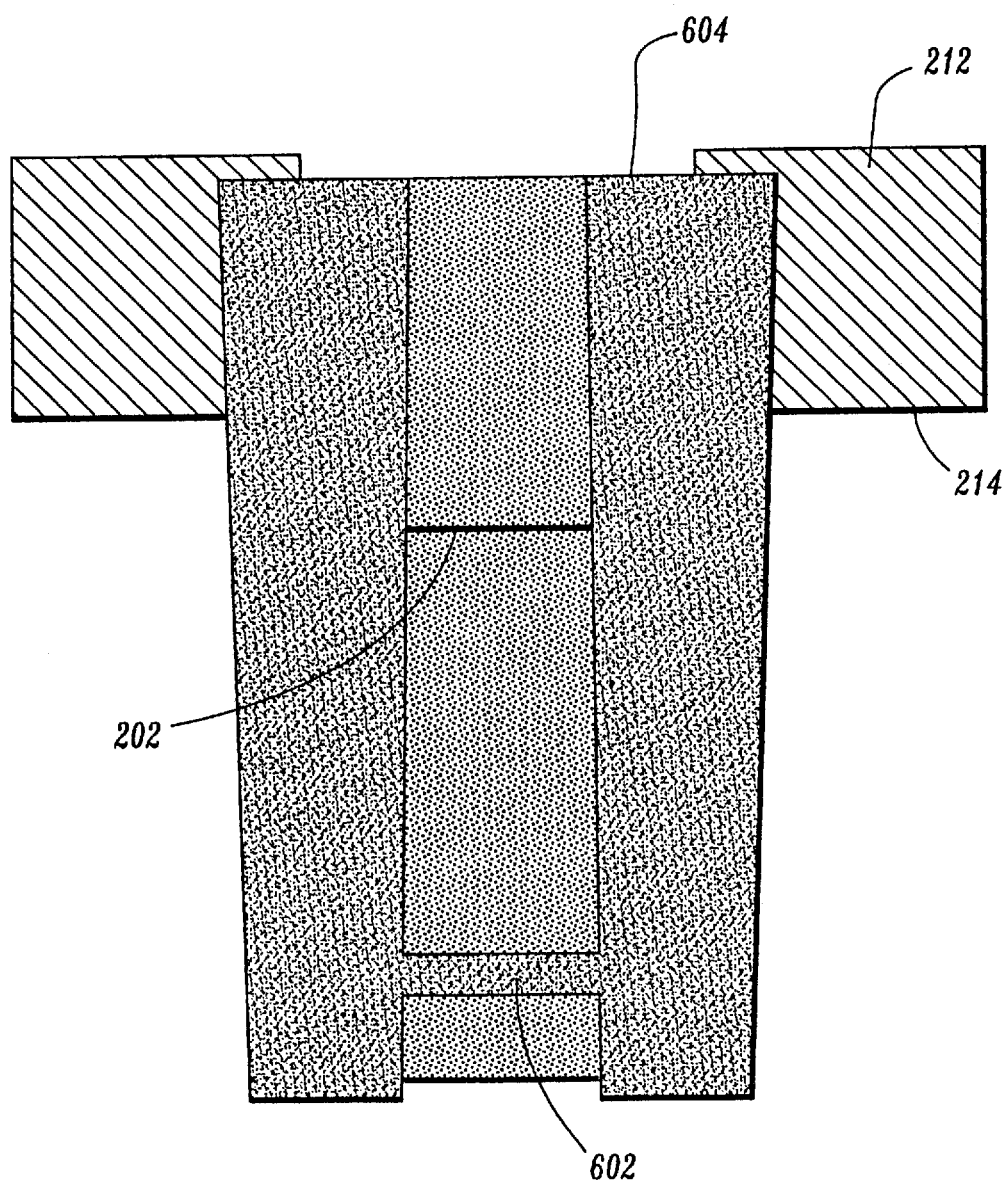
FIG. 6 is diagram of a cross-section of a trench-sidewall vertical device DRAM cell along a long axis of the trench according to an embodiment of the present invention.

Referring to FIG. 2, a first oxide liner 202 and a second oxide liner 204 encapsulate the nitride spacers 206 and 208. The spacers 206 and 208 are formed in the upper portion of the trench and completely covered by the gate poly 210. Also shown are a pad nitride layer 212 and a pad oxide 214. FIG. 6 shows a cross-section of the deep trench structure shown in FIG. 2, including a top trench oxide layer 602, an isolation trench structure 604, the pad nitride layer 212 and the pad oxide layer 214. The first oxide liner 202 is shown spanning the trench.

Figure 3:
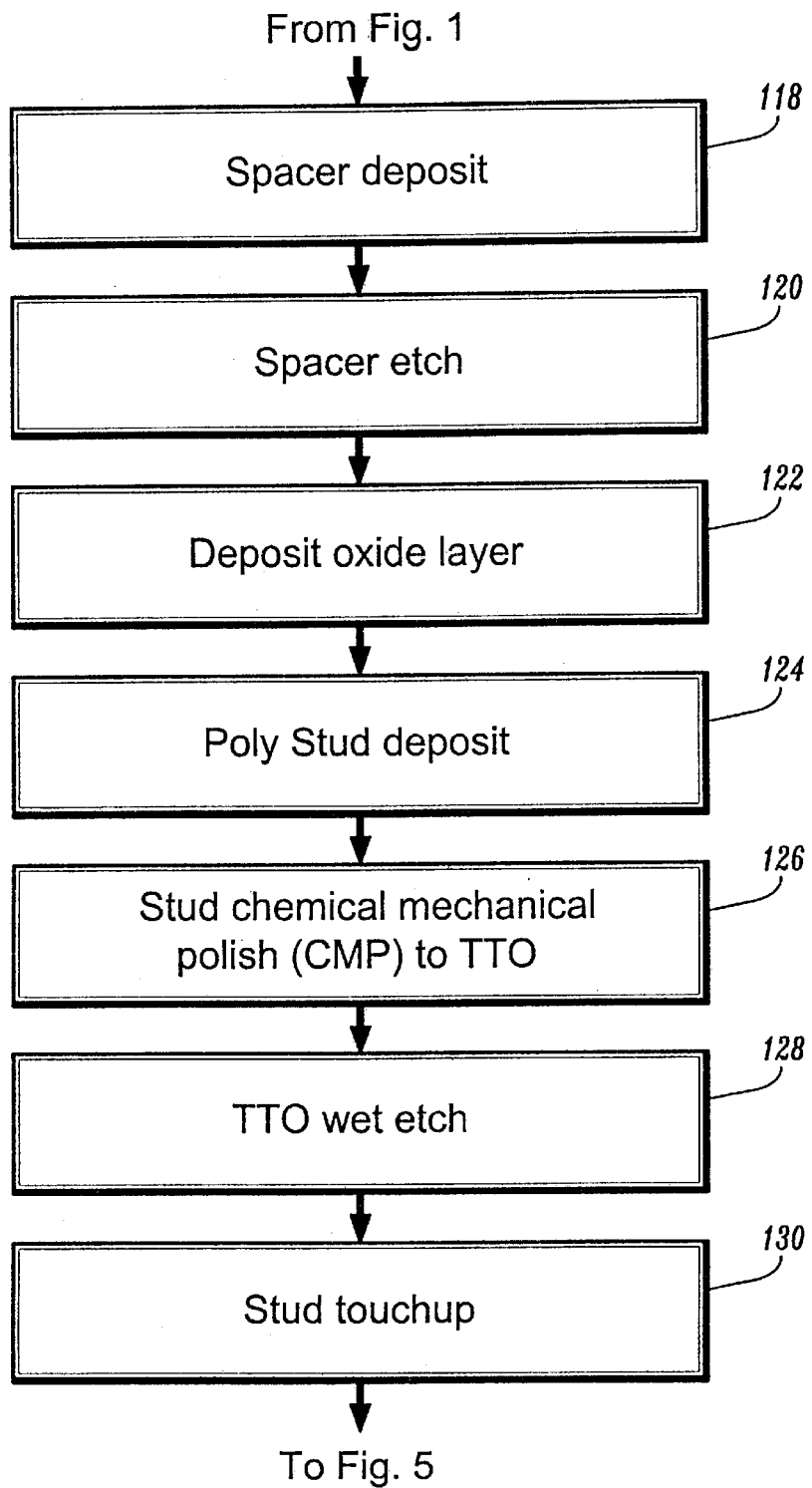
FIG. 3 is a continuation of the method of FIG. 1, according to an embodiment of the present invention.

According to FIG. 3, a spacer is deposited 118 along the walls of the trench. The shoulder of the spacer is pulled down by an etch 120, sufficiently below the pad nitride surface. The depth of the top of the spacer needs to be low enough so that the spacer can be covered by poly Si stud material. The side of the spacer towards the pad nitride is protected by the oxide liner, which is put down before the spacer nitride deposition. The oxide liner also protects the corner of the pad nitride around the trench during the spacer etch 120. This is the only portion where the pad nitride is exposed to the spacer etch. The remaining portion of the pad nitride surface is protected by the top trench oxide. An oxide liner 122 is grown over the first spacer and the top of the poly. A poly study is deposited 124 and the excess portions are removed by a chemical mechanical polish (CMP) down to the top trench oxide 126. The top trench oxide is set etched 128 (e.g., gate conductor etch), for example, by a wet etch, to expose the pad nitride. A stud touchup 130 is performed to level the poly stud to the level of the pad nitride.

Figure 4:
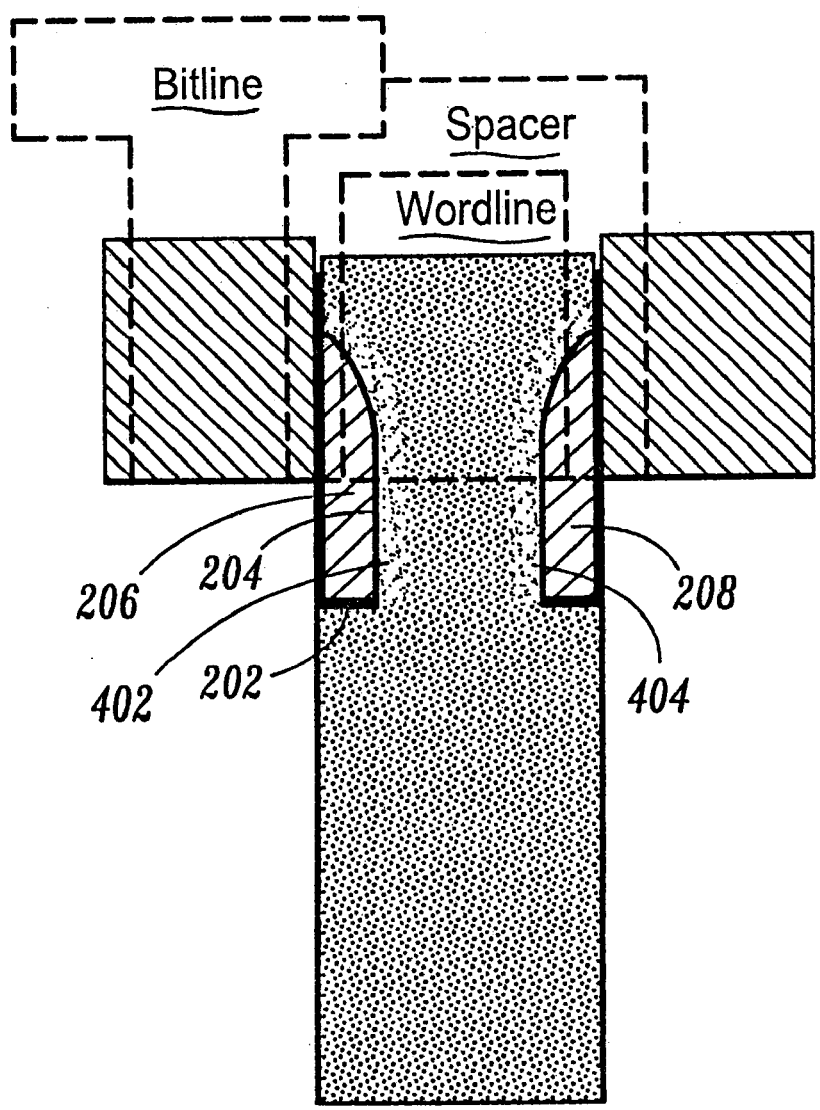
FIG. 4 is a diagram of a cross-section of a trench-sidewall vertical device DRAM cell including a deep trench inside nitride spacer according to an embodiment of the present invention.
Figure 7:
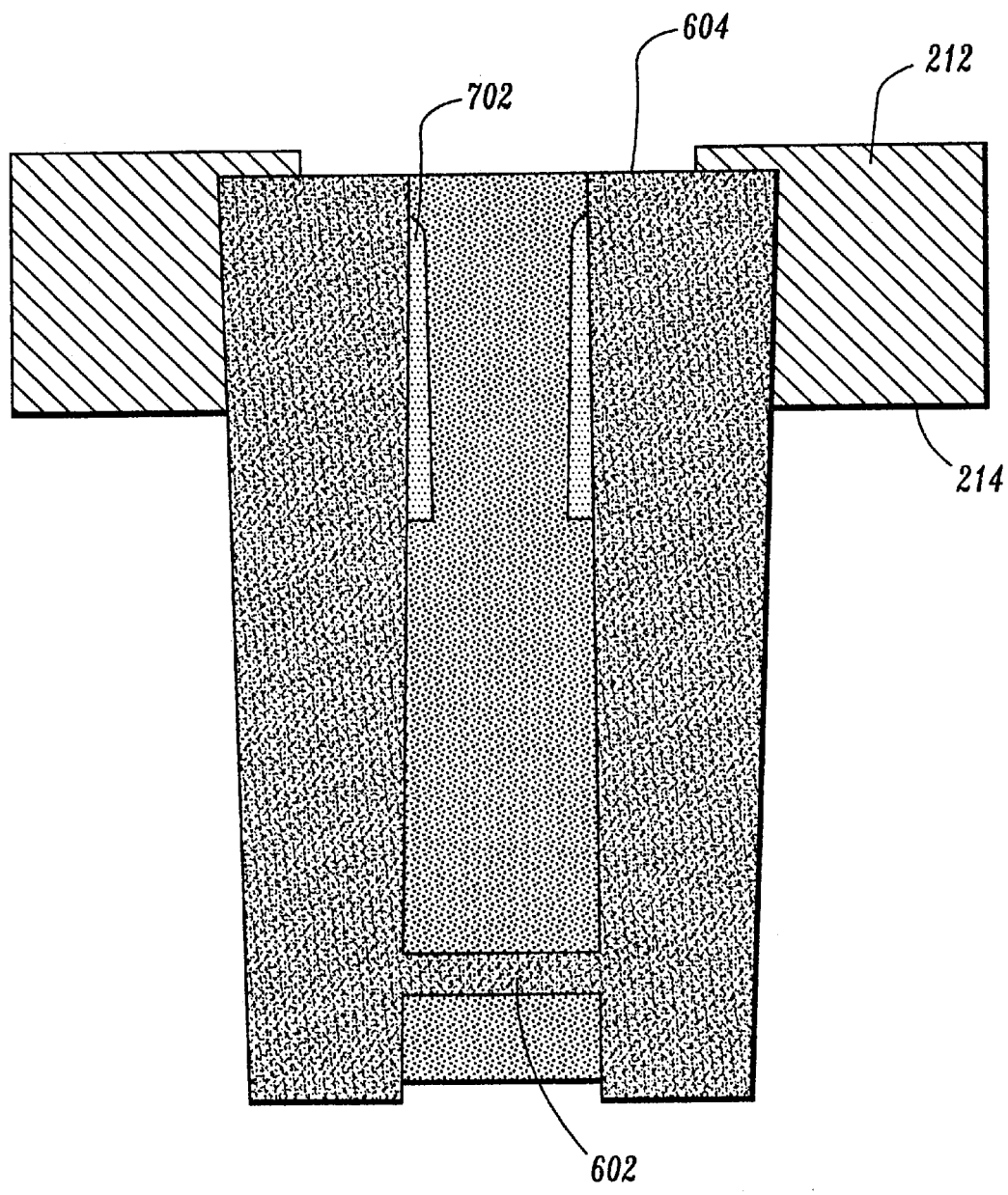
FIG. 7 is diagram of a cross-section of a trench-sidewall vertical device DRAM cell along a long axis of the trench according to an embodiment of the present invention.

Referring to FIG. 4, the second spacers 402 and 404 are deposited on the portion of the second oxide layer 204 covering the spacers 206 and 208. Further, the portion of the first oxide layer 202 which is not covered by either spacer 206 and 208 has been removed. FIG. 7 is a cross-sectional view of the deep trench shown in FIG. 4, including, inter alia, the top trench oxide layer 602, the isolation trench structure 604, wherein the isolation trench is filled with oxide and planarized. The pad nitride layer 212 and the pad oxide layer 214 are also shown. The second spacer 702 is shown deposited on the isolation trench walls, e.g., the new deep trench walls. The process of forming the isolation trench removed a portion of the deep trench walls and a portion of the first spacer along the corresponding deep trench walls, thus forming new sidewalls. The second spacer is deposited on these new sidewalls as well as on the oxidation liner over the first spacer.

The isolation trench 604 has a negative taper with respect to the deep trench as shown in FIGS. 6 and 7. The stringers are poly Si stringers along the isolation trench boundaries within the trench, along the short axis of the trench, remaining after an etch step. The second spacer 702 creates a positive taper, thus preventing the formation of the poly Si stringers.

A second spacer is implemented after the isolation trench CMP, e.g., before the pad nitride strip. At this point the AA etch has cut out both ends of the deep trench with the AA line pattern and these AA trenches are filled with oxide and planarized. Along the sidewall of the oxide trench, the deep trench poly is hidden under oxide since the isolation trenches have a taper. Later on in the method, deep trench poly under the taper will not be etched out by the gate conductor etch and possible poly stringers (rails) may give contact to the bitline contacts. This is also known as the Batman effect for the Arterion chip.

Figure 5:
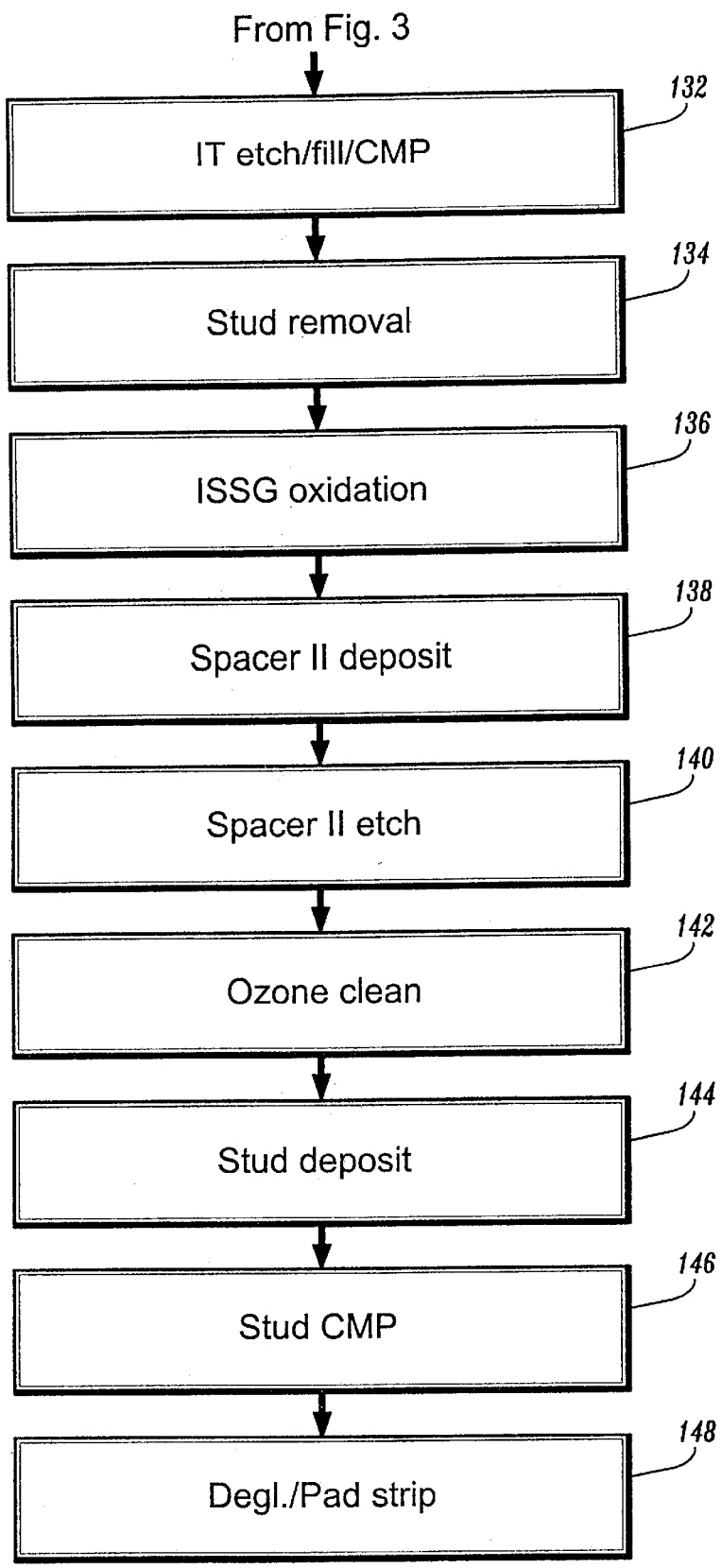
FIG. 5 is a continuation of the method of FIG. 3, according to an embodiment of the present invention.

Referring to FIG. 5, according to an embodiment of the present invention, an etch, fill, CMP sequence is preformed 132. The sacrificial stud is removed from the trench 134 and a second oxidation layer is grown 136. The second spacer is deposited 138 in the trench and etched 140, wherein the second spacer is removed from the bottom portion of the trench. An ozone cleaning is performed to remove organic contaminants 142. The trench is filled with poly stud material 146 and a CMP is performed 146, followed by a pad strip 148, preparing the device for wordline and bitline formation.

The system and method are designed to encapsulate the spacer in oxide or poly Si. The encapsulation prevents the spacer from being stripped out with the pad nitride strip. The advantage of the present invention is that no divot refill and etch back is needed. The spacer should also be higher with respect to the Si surface, which is conserved. Thus, the gate conductor etch can remove the poly Si of the deep trench stud on top of the spacer nitride.

Trapped poly stringers under the AA oxide are etched out with the sacrificial poly stud using an isotropic poly etch after isolation trench planarization. Depending on the selectivity of the poly etch to the oxide and for safety reasons of any remaining poly filament another oxide liner may be grown.

The thickness of the nitride spacer is designed to a value where there is no negative slope left from the isolation trench oxide trench, which is cutting in to the deep trench. The needed spacer thickness will be in the range of 10 nm to 20 nm. One skilled in the art will recognize in light of the present application that spacer thickness can vary between applications and that other thicknesses are contemplated. The second deep trench inside spacer is also covered by the poly stud and is thus conserved at the pad nitride strip. Therefore, the shoulder of the second spacer needs to be pulled down sufficiently so that there will be a poly Si cover. Because the second spacer process widens the first spacer, the first spacer can be reduced in width by the width of the second spacer.

Having described embodiments for a system and method for integrating an inside nitride spacer into a deep trench DRAM device, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method for forming an inside nitride spacer in a deep trench device DRAM cell comprising the steps of:

etching a first poly stud from a trench comprising a first spacer positioned on a sidewall of the trench, wherein a portion of the sidewalls is formed of an isolation trench oxide;

depositing an oxide layer on a surface of the deep trench device DRAM cell, wherein the oxide layer covers the first spacer; and forming a second spacer on a portion of the oxide layer covering the first spacer in the trench.

2. The method of claim 1, further comprising the steps of:

etching a portion of the second spacer from a bottom portion of the trench, wherein a portion of the oxide layer over a gate poly of the trench is exposed;

performing an ozone cleaning to remove exposed portions of the oxide layer from the trench;

depositing a second poly stud, filling the deep trench;

polishing the deep trench device DRAM cell to a pad nitride layer formed on a surface of the deep trench device DRAM cell; and stripping a portion of the pad nitride layer.

3. The method of claim 1, wherein the first spacer was formed by a conservation method.

4. The method of claim 3, wherein the conservation method further comprises the steps of:

depositing an oxide liner in the trench etched from a substrate and a pad nitride layer deposited over the substrate, wherein a pad oxide layer lines the trench and underlies the pad nitride layer, and wherein the oxide liner covers a recessed gate poly in the trench;

depositing the first spacer on the oxide liner wherein a portion of the oxide liner covering the recessed gate poly is exposed in the trench;

removing the exposed portion of the oxide liner from the recessed gate poly in the trench; and filling the trench with the first poly stud material, wherein the spacer material is encapsulated in the poly stud material.

5. The method of claim 1, wherein the first spacer is formed at a depth shallower than a junction depth.

6. The method of claim 1, wherein the second spacer is deposited having a positive taper on the isolation trench oxide.

7. The method of claim 1, wherein the thickness of the first spacer is reduced by the thickness of the second spacer, wherein a combined width of the first and second spacer overlaps a gate conductor spacer adjacent to a wordline, wherein the first and second spacers substantially prevents a bitline contact from contacting the gate poly material in the trench.

8. A method for forming an inside nitride spacer in a deep trench device DRAM cell comprising the steps of:

forming a first spacer in a trench encapsulated in an oxide liner on a sidewall of the trench and an oxide layer over the first spacer, wherein the trench is etched in a semiconductor material and a pad nitride layer, wherein a pad oxide layer is disposed between the semiconductor material and the pad nitride layer and lines the trench;

forming a second spacer over the first spacer, wherein the oxide layer is disposed between the first spacer and the second spacer;

filling the trench with a first poly stud material; and stripping the pad nitride layer.

9. The methods of claim 8, wherein forming the first spacer further comprises;

depositing the oxide liner in the trench, wherein the oxide liner covers a recessed gate poly in the trench and a sidewall of the trench;

depositing the first spacer on the oxide liner wherein a portion of the oxide liner covering the recessed gate poly is exposed in the trench;

removing the exposed portion of the oxide liner from the recessed gate poly in the trench; and filling the trench with the poly stud material, wherein the spacer material is encapsulated in the poly stud material.

10. The method of claim 8, wherein the first spacer is formed at a depth shallower than a junction depth.

11. The method of claim 8, wherein a combined width of the first and second spacer overlaps a gate conductor spacer adjacent to wordline, wherein the first and second spacers substantially prevents a bitline contact from contacting the gate poly material in the trench.

12. The method of claim 8, wherein forming the second spacer further comprises:

etching a second poly stud from a trench comprising the first spacer positioned on a sidewall of the trench, wherein a portion of the sidewall is formed of an isolation trench oxide;

depositing the oxide layer on a surface of the deep trench device DRAM cell, wherein the oxide layer covers the first spacer; and forming the second spacer on a portion of the oxide layer covering the first spacer in the trench.

13. The method of claim 12, further comprising the steps of:

etching a portion of the second spacer from a bottom portion of the trench, wherein a portion of the oxide layer over a gate poly of the trench is exposed;

performing an ozone cleaning to remove exposed portions of the oxide layer from the trench;

depositing a first poly stud, filling the trench;

polishing the deep trench device DRAM cell to the pad nitride layer; and stripping a portion of the pad nitride layer.

14. The method of claim 12, wherein the second spacer is deposited having a positive taper on the isolation trench oxide.

* * * * *